US006399276B1

(12) United States Patent
Van Damme et al.

(10) Patent No.: US 6,399,276 B1
(45) Date of Patent: Jun. 4, 2002

(54) PROCESSLESS PRINTING PLATE WITH COVER LAYER CONTAINING COMPOUNDS WITH CATIONIC GROUPS

(75) Inventors: Marc Van Damme, Mechelen; Joan Vermeersch, Deinze, both of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/599,966

(22) Filed: Jun. 23, 2000

Related U.S. Application Data

(60) Provisional application No. 60/143,931, filed on Jul. 15, 1999.

(30) Foreign Application Priority Data

Jun. 29, 1999 (EP) .......................................... 99202110

(51) Int. Cl.[7] .................................................. G03F 7/11

(52) U.S. Cl. .................... 430/273.1; 430/302; 430/944; 430/945

(58) Field of Search .......................... 430/270.1, 271.1, 430/272.1, 273.1, 944, 945, 302, 303

(56) References Cited

U.S. PATENT DOCUMENTS 4,268,575 A * 5/1981 Shinozaki et al. .......... 428/336
4,731,317 A * 3/1988 Fromson et al. ............ 430/159
4,740,450 A * 4/1988 Tamaoki et al. ............ 430/273
4,745,042 A * 5/1988 Sasago et al. .............. 430/156
4,946,758 A * 8/1990 Kurtz et al. ................ 430/259
5,035,981 A * 7/1991 Kurtz et al. ................ 430/327
5,379,698 A * 1/1995 Nowak et al. .............. 101/454
5,773,194 A * 6/1998 Hattori et al. ........... 430/284.1
5,985,515 A * 11/1999 Van Rompuy et al. .. 430/272.1
6,010,817 A * 1/2000 Van Damme et al. ...... 430/200
6,083,663 A * 7/2000 Vermeersch et al. ........ 430/302
6,090,524 A * 7/2000 Deboer et al. ........... 430/272.1
6,110,645 A * 8/2000 DeBoer et al. ............. 430/302
6,136,508 A * 10/2000 DeBoer et al. ............. 430/302
6,190,830 B1 * 2/2001 Leon et al. .............. 430/270.1
6,197,478 B1 * 3/2001 Vermeersch et al. ..... 430/272.1
6,207,348 B1 * 3/2001 Deboer et al. .............. 430/302
6,210,857 B1 * 4/2001 Vermeersch et al. ..... 430/270.1
6,230,621 B1 * 5/2001 Verschueren et al. ....... 101/453

FOREIGN PATENT DOCUMENTS

EP 573 092 A1 * 12/1993
WO WO-99/19143 * 4/1999

* cited by examiner

*Primary Examiner*—Janet Baxter
*Assistant Examiner*—Barbara Gilmore
(74) *Attorney, Agent, or Firm*—Breiner & Breiner, L.L.C.

(57) ABSTRACT

According to the present invention there is provided a heat-sensitive material for making lithographic plates comprising in the order given on a support an IR-sensitive oleophilic layer and a cross-linked hydrophilic layer, wherein said heat-sensitive material is covered with a layer comprising at least an organic compound comprising cationic groups.

9 Claims, No Drawings

PROCESSLESS PRINTING PLATE WITH COVER LAYER CONTAINING COMPOUNDS WITH CATIONIC GROUPS

This application claims the benefit of U.S. Provisional Application No. 60/143,931 filed Jul. 15, 1999.

FIELD OF THE INVENTION

The present invention relates to a heat mode recording material for making a lithographic plate for use in lithographic printing. The present invention further relates to a method for imaging said heat mode recording material e.g. by means of a laser.

BACKGROUND OF THE INVENTION

Lithographic printing is the process of printing from specially prepared surfaces, some areas of which are capable of accepting ink (oleophilic areas) whereas other areas will not accept ink (hydrophilic areas). According to the so called conventional or wet printing plates, both water or an aqueous dampening liquid and ink are applied to the plate surface that contains hydrophilic and oleophilic areas. The hydrophilic areas will be soaked with water or the dampening liquid and are thereby rendered oleophobic while the oleophilic areas will accept the ink.

When a laser heat mode recording material is to be used as a direct offset master for printing with greasy inks, it is necessary to have oleophilic-hydrophilic mapping of the image and non-image areas. In the case of heat mode laser ablation it is also necessary to completely image wise remove a hydrophilic or oleophilic topcoat to expose the underlying oleophilic respectively hydrophilic surface of the laser sensitive recording material in order to obtain the necessary difference in ink-acceptance between the image and non-image areas.

For example DE-A-2 448 325 discloses a laser heat mode "direct negative" printing plate comprising e.g. a polyester film support provided with a hydrophilic surface layer. The disclosed heat mode recording material is imaged using an Argon laser thereby rendering the exposed areas oleophilic. An offset printing plate is thus obtained which can be used on a printing press without further processing. The plate is called a "direct negative" plate because the areas of the recording material that have been exposed are rendered ink accepting.

Other disclosures in DE-A-2 448 325 concern "direct negative" printing plates comprising e.g. hydrophilic aluminum support coated with a water soluble laser light (Argon-488 nm) absorbing dye or with a coating based on a mixture of hydrophilic polymer and laser light absorbing dye (Argon-488 nm). Further examples about heat mode recording materials for preparing "direct negative" printing plates include e.g. U.S. Pat. No. 4,341,183, DE-A-2 607 207, DD-A-213 530, DD-A-217 645 and DD-A-217 914. These documents disclose heat mode recording materials that have on an anodized aluminum support a hydrophilic layer. The disclosed heat mode recording materials are image-wise exposed using a laser. Laser exposure renders the exposed areas insoluble and ink receptive, whereas the non exposed image portions remain hydrophilic and water soluble allowing to be removed by the dampening liquid during printing exposing the hydrophilic support. Such plates can be used directly on the press without processing.

DD-A-155 407 discloses a laser heat mode "direct negative" printing plate where a hydrophilic aluminum oxide layer is rendered oleophilic by direct laser heat mode imaging. These printing plates may also be used on the press without further processing.

From the above it can be seen that a number of proposals have been made for making a 'direct negative' offset printing plate by laser heat mode recording. They have such disadvantages as low recording speed and/or the obtained plates are of poor quality.

Another way of making direct lithographic plates is by laser ablation.

EP-A-580 393 discloses a lithographic printing plate directly imageable by laser discharge, the plate comprising a topmost first layer and a second layer underlying the first layer wherein the first layer is characterized by efficient absorption of infrared radiation and the first and second layer exhibit different affinities for at least one printing liquid.

EP-A-683 728 discloses a heat mode recording material comprising on a support having an ink receptive surface or being coated with an ink receptive layer a substance capable of converting light into heat and a hardened hydrophilic surface layer having a thickness not more than 3 $\mu$m. The lithographic properties of said material are not very good.

OBJECTS OF THE INVENTION

It is an object of the present invention to provide a material for a heat mode recording material of high sensitivity and high lithographic quality, especially in regard to little toning at start-up and a low dot gain.

SUMMARY OF THE INVENTION

According to the present invention there is provided a heat-sensitive material for making lithographic plates comprising in the order given on a support an IR-sensitive oleophilic layer and a cross-linked hydrophilic layer, characterized in that said heat-sensitive material is covered with a layer comprising at least an organic compound comprising cationic groups.

DETAILED DESCRIPTION OF THE INVENTION

The organic compounds having cationic groups for use in connection with the present invention are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysaccharides modified with one or more groups containing an ammonium or amino group.

Most preferred organic compounds having cationic groups are dextrans or pullulan wherein at least some of the hydroxy groups have been modified into one or more of the following groups:

$$—O—R^1$$

$$—O—CO—R^2$$

wherein $R^1$ represents an organic residue containing an amino or ammonium group, e.g. an amine substituted alkyl, an amine substituted alkylaryl etc.

$R^2$ has one of the significances given for $R^1$ or stands for $—OR^3$ or $—N(R^4)R^5$, wherein $R^3$ has one of the significances given for $R^1$ and each of $R^4$ and $R^5$ which may be the same or different and have one of the significances given for $R^1$.

Pullulan is a polysaccharide that is produced by microorganism of the *Aureobasidium pullulans* type (*Pullularia pullulans*) and that contains maltotriose repeating units connected by a a-1,6 glycosidic bond. Pullulan is generally produced on industrial scale by fermentation of partially hydrolyzed starch or by bacterial fermentation of sucrose. Pullulan is commercially available from e.g. Shodex, Pharmacosmos.

Examples of dextrans or pullulan suitable for use in accordance with the present invention are dextrans or pullulan wherein some of the hydroxyl groups have been modified in one of the groups shown in table 1.

TABLE 1

| no. | modified group |
|---|---|
| 1 | —O—$CH_2$—$CH_2$—$NH_2$ |
| 2 | —O—CO—NH—$CH_2$—$CH_2$—$NH_2$ |
| 3 | —O—CO—NH—$CH_2$—$CH_2$—N($CH_2$—$CH_2$—$NH_2$)$_2$ |
| 4 | —O—$CH_2$—$CH_2$—NH—$CH_2$—$CH_2$—$NH_2$ |
| 5 | —O—$CH_2$—$CH_2$—NH—$CH_2$—CHOH—$CH_2$—$N^+(CH_3)_3Cl^-$ |
| 6 | —O—($CH_2$—$CH_2$—O)$_n$—$CH_2$—$CH_2$—$NH_2$ |
| | wherein n represents an integer from 1 to 50 |
| 7 | —O—CO—NH—$CH_2$—$CH_2$—NH—$CH_2$—CHOH—$CH_2$—$N^+(CH_3)_3Cl^-$ |
| 8 | —O—$CH_2$—$CH_2$—N($CH_2$—$CH_3$)$_2$.HCl |
| 9 | —O—$CH_2$—$CH_2$—N($CH_2$—$CH_2$—$NH_2$)$_2$ |
| 10 | —O—CONH—$CH_2$—$CH_2$—N($CH_2$—$CH_2$—$NH_2$)$_2$ |
| 11 | —O—CONH—($CH_2$—$CH_2$—O)$_n$—$CH_2$—$CH_2$—$NH_2$ |

The modified dextrans or pullulan can be prepared by a reaction of a dextran with e.g. alkylating agents, chloroformates, acid halides, carboxylic acids etc.

The organic compound having one or more cationic groups according to the invention is preferably provided in an amount of 10 to 2000 mg/m$^2$ and more preferably in an amount of 20 to 1000 mg/m$^2$.

Different kinds of hardened hydrophilic surface layers are suitable in connection with the present invention. The hydrophilic coatings are preferably cast from aqueous compositions containing hydrophilic binders having free reactive groups including e.g. hydroxyl, carboxyl, hydroxyethyl, hydroxypropyl, amino, aminoethyl, aminopropyl, carboxymethyl, etc. along with suitable crosslinking or modifying agents including e.g. hydrophilic organotitanium reagents, aluminoformyl acetate, dimethylol urea, melamines, aldehydes, hydrolyzed tetraalkyl orthosilicate, etc.

Suitable polymers for hydrophilic layers may be selected from the group consisting of gum arabic, casein, gelatin, starch derivatives, carboxymethyl cellulose and Na salt thereof, cellulose acetate, sodium alginate, vinyl acetate-maleic acid copolymers, styrene-maleic acid copolymers, polyacrylic acids and salts thereof, polymethacrylic acids and salts thereof, hydroxyethylene polymers, polyethylene glycols, hydroxypropylene polymers, polyvinyl alcohols, and hydrolyzed polyvinylacetate having a hydrolyzation degree of at least 60% by weight and more preferably at least 80% by weight.

Hydrophilic layers containing polyvinylalcohol or polyvinylacetate hydrolyzed to an extent of at least 60% by weight hardened with a tetraalkyl orthosilicate, e.g. tetraethyl orthosilicate or tetramethyl orthosilicate, as disclosed in e.g. U.S. Pat. No. 3,476,937 are particularly preferred because their use in the present heat mode recording material results in excellent lithographic printing properties.

A further suitable hardened hydrophilic surface layer is disclosed in EP-A-514 990. The hydrophilic layer disclosed in this EP-application comprises the hardening reaction product of a (co)polymer containing amine or amide functions having at least one free hydrogen (e.g. amino modified dextran) and aldehyde.

A cross-linked hydrophilic binder in the heat-sensitive layer used in accordance with the present embodiment preferably also contains substances that increase the mechanical strength and the porosity of the layer e.g. metal oxide particles that are particles of titanium dioxide or other metal oxides. Incorporation of these particles gives the surface of the cross-linked hydrophilic layer a uniform rough texture consisting of microscopic hills and valleys. Preferably these particles are oxides or hydroxides of beryllium, magnesium, aluminum, silicon, gadolinium, germanium, arsenic, indium, tin, antimony, tellurium, lead, bismuth or a transition metal. Particularly preferable particles are oxides or hydroxides of aluminum, zirconium, silicon and titanium, used in 20 to 95% by weight of the hydrophilic layer, more preferably in 30 to 90% by weight of the hydrophilic layer.

The cross-linked hydrophilic layer is preferably coated at a dry thickness of 0.3 to 5 $\mu$m, more preferably at a dry thickness of 0.5 to 3 $\mu$m.

According to the present invention the hardened hydrophilic layer may comprise additional substances such as e.g. plasticizers, pigments, dyes etc. The cross-linked hydrophilic layer can additionally contain an IR-absorbing compound in order to increase the IR-sensitivity.

The IR-sensitive oleophilic layer comprises an oleophilic binder and a compound capable of converting light into heat.

Suitable compounds capable of converting light into heat are preferably infrared absorbing components having an absorption in the wavelength range of the light source used for image-wise exposure. Particularly useful compounds are for example dyes and in particular infrared dyes as disclosed in EP-A-908 307 and pigments and in particular infrared pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends i.a. on the heat-sensitivity of the imaging element. In this respect it has been found that carbon black yields very good and favorable results.

Preferably the oleophilic polymer is selected from the group consisting of polyvinyl chloride, polyesters, polyurethanes, novolac, polyvinyl carbazole etc., copolymers or mixtures thereof.

Most preferably the polymeric binder in the recording layer is heat sensitive: e.g. a polymer containing nitrate ester groups (e.g. self oxidizing binder cellulose nitrate as disclosed in GB-P-1 316 398 and DE-A-2 512 038); e.g. a polymer containing carbonate groups (e.g. polyalkylene carbonate); e.g. a polymer containing covalently bound chlorine (e.g. polyvinylidene chloride). Also substances containing azo or azide groups , capable of liberating $N_2$ upon heating are favorably used.

Preferably, the oleophilic layer is coated at a dry weight from 0.5 to 30 g/m$^2$, preferably from 3 to 15 g/m$^2$.

The support according to the present invention is preferably dimensionally stable and can be aluminum or another metal or alloy. Preferentially electrochemically and/or mechanically grained and anodized aluminum is used in the present invention.

Furthermore in connection with the present invention, the support can be a flexible support. As flexible support in connection with the present embodiment it is particularly preferred to use a plastic film e.g. substrated polyethylene terephthalate film, polyethylene naphthalate film, cellulose acetate film, poly-styrene film, polycarbonate film, polyethylene film, polypropylene film, polyvinyl chloride film, polyether sulphone film. The plastic film support may be opaque or transparent. The plastic film is preferably subbed with subbing layers as described in EP-A-619 524, EP-A-619 525 and EP-A-620 502.

Still further paper or glass of a thickness of not more than 1.2 mm can also be used.

In accordance with the present invention the imaging element is image-wise exposed. During said exposure, in the exposed areas the cover layer and the cross-linked hydrophilic layer can be removed and said areas are converted to oleophilic areas while the unexposed areas remain hydrophilic. This is mostly the case when using short pixel dwell times (for example 1 to 100 ns). However when using longer pixel dwell times (for example 1 to 20 μs) the hydrophilic layer is not or only partially removed. The remaining parts of the hydrophilic layer can be removed on the press by contact with fountain solution and ink or by an additional wet or dry processing step between the IR-laser exposure and the start-up of the printing process.

Image-wise exposure in connection with the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near infrared with an intensity greater than 0.1 mW/μm$^2$.

According to the present invention the plate is then ready for printing without an additional development and can be mounted on the printing press.

According to a further method, the imaging element is first mounted on the printing cylinder of the printing press and then image-wise exposed directly on the press. Subsequent to exposure, the imaging element is ready for printing.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slid on the print cylinder instead of mounting a conventional printing plate. More details on sleeves are given in "Grafisch Nieuws", 15, 1995, page 4 to 6.

The following example illustrates the present invention without limiting it thereto. All parts and percentages are by weight unless otherwise specified.

EXAMPLE

On top of an aluminum substrate was coated the IR-sensitive layer to a wet coating thickness of 50 μm from a solution having the following composition:

| | |
|---|---|
| 279.3 g | Carbon black dispersion of the following composition |
| | 34.9 g Special Schwarz ™ (Degussa) |
| | 3.5 g Nitrocellulose E950 ™ (Wolf Walsrode) |
| | 4.2 g Dispersing agent |
| | 236.7 g Methyl ethyl ketone |
| 217.8 g | Nitrocellulose solution of the following composition |
| | 21.8 g Nitrocellulose E950 ™ |
| | 196.0 g Ethylacetate |
| 24.0 g | Cymel solution of the following composition |
| | 4.8 g Cymel 301 ™ |
| | 19.2 g Ethylacetate |
| 8.75 g | p-toluene sulphonic acid solution of the following composition |
| | 0.875 g p-toluene sulphonic acid |
| | 7.875 g Ethylacetate |

After drying the IR-sensitive layer, the hydrophilic layer was coated to a wet coating thickness of 20 μm from a solution having the following composition 70.0 g $TiO_2$- dispersion in water, stabilized with Polyviol WX 48™ (polyvinyl alcohol from Wacker) (10% w/w polyvinyl alcohol versus $TiO_2$) (average particle size 0.3 to 0.5 μm)–6.25% w/w 30.0 g hydrolyzed tetramethyl orthosilicate in water/ethanol-6.25% w/w 1.2 g wetting agent in water-5% w/w The pH of this solution was adjusted to 4 prior to coating. This layer was hardened for 12 hours at 67° C./50% R.H. In this way the reference element was obtained.

The elements 1, 2, 3, 4 and 5 were prepared as follow:

On top of the imaging element, as described in the reference element, was coated a hydrophilic layer from a 1% w/w solution in water from a diethylaminoethoxylated dextran (Dormacid™ from Pfeifer& Langen) This hydrophilic layer was coated to a dry thickness of 0.05 g/m$^2$ (element 1), 0.1 g/m$^2$ (element 2), 0.25 g/m$^2$ (element 3), 0.50 g/m$^2$ (element 5, 0.75 g/m$^2$ (element 5). Element 6 was prepared as follows:

The imaging element as described in the reference element was treated with a 1% w/w solution in water of Dormacid™ by rinsing with a cotton pad soaked in the described solution.

The resulting imaging elements were imaged on a Creo 3244 Trendsetter™ at 2400 dpi operating at a drum speed of 80 rpm and a laser output of 15.5 Watt.

After imaging the plate was mounted on a GTO 52 press using K+E 800 as ink and rotamatic as fountain solution.

Subsequently the press was started by allowing the print cylinder with the imaging element mounted thereon to rotate. The dampener rollers of the press were first dropped on the imaging element so as to supply dampening liquid to the imaging element and after 10 revolutions of the print cylinder, the ink rollers were dropped to supply ink. After 10 further revolutions paper was feeded. The Dmin and the dot area of the 50% screen at 200 lpi were measured at prints 5, 25 and 50 with a Macbeth RD918-SB. The results are summarized in the tables 2 and 3

TABLE 2

| Dmin of the elements | | | |
|---|---|---|---|
| Element | Page 5 | Page 25 | Page 50 |
| Reference | 0.16 | 0.09 | 0.04 |
| 1 | 0.01 | 0.00 | 0.01 |
| 2 | 0.00 | 0.01 | 0.00 |
| 3 | 0.01 | 0.00 | 0.00 |
| 4 | 0.00 | 0.00 | 0.01 |
| 5 | 0.01 | 0.01 | 0.00 |
| 6 | 0.00 | 0.01 | 0.01 |

TABLE 3

| Dot area of a 50% screen at 200 lpi | | | |
|---|---|---|---|
| Element | Print 5 | Print 25 | Print 50 |
| Reference | 90 | 91 | 89 |
| 1 | 70 | 71 | 72 |
| 2 | 70 | 72 | 73 |
| 3 | 71 | 69 | 70 |
| 4 | 72 | 72 | 71 |
| 5 | 71 | 69 | 72 |
| 6 | 70 | 72 | 72 |

From these results it is clear that an additional cationic hydrophilic cover layer of a diethylaminoethoxylated dextran improves the lithographic characteristics i.e. less toning at start-up and a lower dot gain.

What is claimed is:

1. A heat-sensitive material for making lithographic plates comprising in the order given on a support an IR-sensitive oleophilic layer and a cross-linked hydrophilic layer, wherein said heat-sensitive material is covered with a layer comprising at least an organic compound comprising cationic groups.

2. A heat-sensitive material according to claim 1 wherein said organic compound is a hydrophilic polymer having one or more ammonium groups or a low molecular weight hydrophilic organic compound having one or more ammonium groups.

3. A heat-sensitive material according to claim 1 wherein said organic compound is comprised in said imaging element in an amount between 0.01 and 2.00 g/m$^2$.

4. A heat-sensitive material according to claim 1 wherein said oleophilic layer is coated at a dry weight from 0.75 to 15 g/m$^2$.

5. A heat-sensitive material according to claim 1 wherein said cross-linked hydrophilic layer comprises oxides or hydroxides of beryllium, magnesium, aluminum, silicon, gadolinium, germanium, arsenic, indium, tin, antimony, tellurium, lead, bismuth, titanium or a transition metal.

6. A heat-sensitive material according to claim 1 wherein the hydrophilic layer has a dry thickness between 0.3 and 5 $\mu$m.

7. A method for making lithographic printing plates comprising the steps of (i) image-wise exposing to a laser beam having an intensity greater than 0.1 mW/$\mu$m$^2$ a heat sensitive material according to claim 1; (ii) before or after step (i) mounting the plate on a printing press; (iii) contacting said plate with fountain solution and ink.

8. A heat-sensitive material for making lithographic plates comprising in the order given on a support an IR-sensitive oleophilic layer and a cross-linked hydrophilic layer, wherein said heat-sensitive material is coated with a layer comprising at least an organic compound comprising cationic groups, wherein said organic compound is a polysaccharide having one or more ammonium groups.

9. A heat-sensitive material according to claim 8 wherein said polysaccharide is dextran or pullulan.

* * * * *